United States Patent [19]
Gainey

[11] Patent Number: 5,338,899
[45] Date of Patent: Aug. 16, 1994

[54] PACKAGING OF ELECTRONIC DEVICES

[75] Inventor: Trevor C. Gainey, Kent, England

[73] Assignee: LSI Logic Corporation, Milpitas, Calif.

[21] Appl. No.: 856,894

[22] PCT Filed: Aug. 28, 1991

[86] PCT No.: PCT/GB91/01458

§ 371 Date: May 14, 1992

§ 102(e) Date: May 14, 1992

[87] PCT Pub. No.: WO92/03845

PCT Pub. Date: Mar. 5, 1992

[30] Foreign Application Priority Data

Aug. 28, 1990 [GB] United Kingdom ............... 9018764

[51] Int. Cl.5 ............................................. H01L 23/02
[52] U.S. Cl. ...................................... 174/52.4; 29/827; 29/841; 437/207
[58] Field of Search ................ 174/52.4, 52.1, 52.2, 174/52.3; 437/206, 207, 211; 29/827, 835, 841; 206/330

[56] References Cited

U.S. PATENT DOCUMENTS

| | | | |
|---|---|---|---|
| 4,096,348 | 6/1978 | Robillard et al. | 174/52.4 |
| 4,672,151 | 6/1987 | Yamamura | 174/52.4 |
| 4,751,611 | 6/1988 | Arai et al. | 174/52.4 X |
| 4,801,561 | 1/1989 | Sankhagowit | 174/52.4 X |
| 4,812,421 | 3/1989 | Jung | 437/211 |
| 4,888,449 | 12/1989 | Crane et al. | 174/52.4 |
| 5,028,983 | 7/1991 | Bickford et al. | 357/69 |
| 5,152,057 | 10/1992 | Murphy | 29/883 |

FOREIGN PATENT DOCUMENTS

0259222 3/1989 European Pat. Off. .

OTHER PUBLICATIONS

Patent Abstracts of Japan, vol. 013, No. 541, (E-854) Dec. 5, 1989 & JP, A,01 223 753 (Fukitsu Ltd) Sep. 6, 1989.

Patent Abstracts of Japan, vol. 012, No. 355 (E-661) Sep. 22, 1988 & JP, A.63 110 661 (Mitsubishi Electric Corp) May 16, 1988.

Patent Abstracts of Japan, vol. 013, No. 378 (E-809) Aug. 22, 1989 & JP,A,01 128 558 (NEC Corp.) May 22, 1989.

*Primary Examiner*—Leo P. Picard
*Assistant Examiner*—Christopher Horgan
*Attorney, Agent or Firm*—Honigman, Miller, Schwartz & Cohen

[57] ABSTRACT

An electronic device (10) encased within a moulded package body (11) has a leadframe (12) extending therefrom. In order to protect the leads (16) for the electronic device a guard ring (14) is provided on the leadframe. By making the guard ring independently of the moulded package body and fitting it separately to the leadframe one can deal with packages of any size in a simple manner and irrespective of the material of the package body (11).

19 Claims, 1 Drawing Sheet

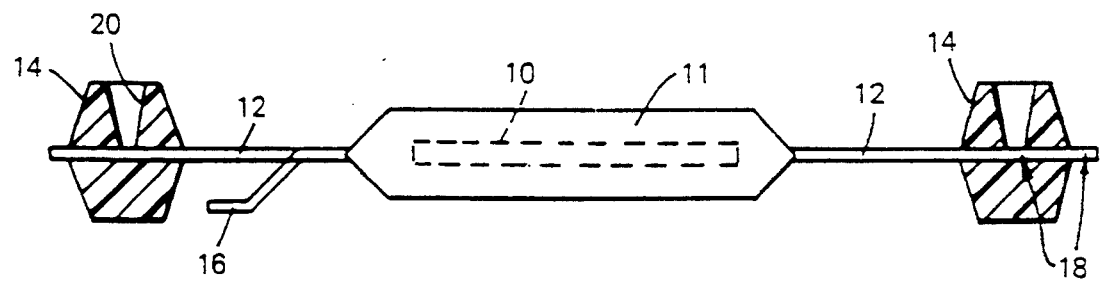

PACKAGING OF ELECTRONIC DEVICES

This invention relates to methods of packaging electronic devices and to electronic devices when packaged.

A commonly used format for electronic packages is what is known as the "quad flat pack" where the leads which are provided to connect a semiconductor device to the remainder of the system are provided on four sides of the semiconductor device and are formed to a "gull-wing" shape. Once the leads have been formed into this shape, they must be protected from any physical damage while in transit from the package manufacturer to the assembly line.

It is known to seek to protect the leads by the use of a guard ring. With such packages, the guard ring is moulded into the package at the same time as the moulding of a plastic package body around the electronic components. Although such simultaneous moulding of the guard ring and of the package body may be suitable for small sized packages, it is inappropriate for larger sized packages where the volume of material required for large body devices would need expensive machinery and give rise to considerable difficulties in the moulding process.

It is therefore an object of the present invention to provide an improved method of packaging electronic devices, using guard means, which overcomes the aforesaid disadvantages and which can be used with packages of any size.

It is a further object of the present invention to provide a method of packaging electronic devices which can be applied equally to packages of plastics material, ceramic material, or indeed any other material.

In accordance with the present invention there is provided a method of packaging an electronic device encased within a package body and having a leadframe extending therefrom, which comprises securing protective guard means to the leadframe separately from the creation of the package body, said guard means defining a spatial zone within which leads extending from the electronic device are protected.

The guard means is preferably a pre-moulded ring which can be secured to the leadframe either by adhesive or by the use of high frequency vibration.

Also in accordance with the present invention there is provided a packaged electronic device comprising an electronic device encased in a package body, a leadframe extending from the package body, and protective guard means made independently of the package body and secured to the leadframe, said guard means being dimensioned and positioned so that leads extending from the electronic device are protected thereby.

Preferably, the guard means is a continuous element circumferentially around the package body.

BRIEF DESCRIPTION OF THE FIGURES

The Figure is a cross-sectional view of an electronic device and packaging method.

In order that the invention may be more fully understood, one presently preferred embodiment in accordance with the invention will now be described by way of example and with reference to the accompanying drawing which is a schematic cross-sectional view through a packaged electronic device.

As shown in the drawing, a semiconductor device indicated by the broken line 10 is enclosed within a protective package body 11 which may be a moulded plastics material or a ceramic material. Extending from the package body 11 on each of the four sides of the semiconductor device is a leadframe 12. Around the periphery of the leadframe 12 is provided a guard ring 14. The term "ring" is used herein to denote any continuous element extending circumferentially around the package body. It may be circular or rectangular for example. The ring is preferably a pre-moulded component of plastics material. The guard ring 14 may be applied to the leadframe 12 either by the use of an adhesive or, preferably, by the application of high frequency vibration in order to provide local melting of the surface layer of the guard ring. The use of high frequency vibration provides a fast and controlled method of attachment of the guard ring 14 which requires less contamination of the leadframe 12 than the use of an adhesive and which does not impose any extra thermal stress on the assembly. Test points are indicated at 18. Test points within the area of the guard ring 14 are made accessible by the provision of apertures 20 through the guard ring to the leadframe.

As shown in the drawing, the leads 16 from the semiconductor device 10 are formed within the space mapped out by the guard ring 14, both in the radial direction and in the axial direction. Because the guard ring 14 is appropriately dimensioned, the formed leads 16 are protected. In other words, the depth of the guard ring 14 is greater than the depth to which the formed leads 16 project below the leadframe.

The leads 16 may be formed within the guard ring and thereby be protected from further damage in transit or left unformed until immediately prior to mounting. While in the unformed state, the outer parts of the leads may be used to provide electrical connections for test and burn-in of the semiconductor device.

Although in the embodiment described above the guard means 14 is referred to as a ring, i.e. a continuous element, it could alternatively be made from a plurality of spaced guard elements serving the same purpose and secured around the leadframe.

I claim:

1. A method of packaging an electronic device encased within a package body and having a leadframe extending therefrom, and leads formed in the leadframe and extending radially from the package body and axially below a plane of the leadframe, comprising:

in a step separate and distinct from forming the package body, securing protective guard means to the leadframe, said guard means extending both above and below the leadframe and defining a spatial zone within which leads extending radially from the electronic device are protected, and said guard means extending axially further below the leadframe than the leads.

2. A method as claimed in claim 1, in which the electronic device is molded within the package body.

3. A method as claimed in claim 1, wherein:
the guard means is secured to the leadframe by the use of high frequency vibration.

4. A packaged electronic device comprising:
an electronic device encased in a package body,
a leadframe extending from the package body and including leads extending both radially from the package body and formed to extend axially below the leadframe to a depth below the leadframe, and
guard means, formed separately and distinctly from the package body and secured to the leadframe, said guard means being disposed both above and below the leadframe for protecting the leads, said guard means being dimensioned and positioned so that it extends axially below the leadframe to a greater depth than the leads.

5. A packaged electronic device as claimed in claim 4, wherein:

the guard means is a continuous element disposed around the package body and spaced radially from the package body.

6. A packaged electronic device as claimed in claim 4, wherein:

the guard means is formed of plastic.

7. A packaged electronic device as claimed in claim 4, wherein:

the guard means is secured to the leadframe by induced local melting of a surface of the guard means.

8. A packaged electronic device as claimed in claim 4, wherein:

the guard means is provided with at least one aperture to provide access to test points on the leadframe.

9. A method as claimed in claim 2, further comprising:

securing the guard means to the leadframe by the use of high frequency vibration.

10. A packaged electronic device as claimed in claim 5, in which the guard means is formed as one or more molded plastic elements.

11. A packaged electronic device as claimed in claim 4, in which the guard means is formed as one or more molded plastic elements.

12. A packaged electronic device as claimed in claim 5, wherein:

the guard means is secured to the leadframe by induced local melting of the guard means.

13. A packaged electronic device as claimed in claim 4, wherein:

the guard means is secured to the leadframe by induced local melting of the guard means.

14. A packaged electronic device as claimed in claim 5, wherein:

the guard means is secured to the leadframe by induced local melting of the guard means.

15. A packaged electronic device as claimed in claim 5, wherein:

the guard means is provided with at least one aperture to provide access to test points on the leadframe.

16. A packaged electronic device as claimed in claim 4, wherein:

the guard means is provided with at least one aperture to provide access to test points on the leadframe.

17. A packaged electronic device as claimed in claim 6, wherein:

the guard means is provided with at least one aperture to provide access to test points on the leadframe.

18. A packaged electronic device as claimed in claim 7, wherein:

the guard means is provided with at least one aperture to provide access to test points on the leadframe.

19. A packaged electronic device as claimed in claim 4, wherein:

the guard means is formed of a plurality of plastic elements.

* * * * *